United States Patent [19]

Lamoureux

[11] 3,906,306

[45] Sept. 16, 1975

[54] ELECTRON BEAM DEFLECTION CIRCUIT INCLUDING THYRISTORS

[75] Inventor: Andre Lamoureux, Paris, France

[73] Assignee: Thomson-CSF, Paris, France

[22] Filed: Nov. 20, 1973

[21] Appl. No.: 417,638

[30] Foreign Application Priority Data

Nov. 22, 1972 France ............................ 72.41492

[52] U.S. Cl. ................................................ 315/408
[51] Int. Cl.[2] ........................................... H01J 29/76
[58] Field of Search ......... 315/27 R, 27 TD, 28, 29, 315/26, 25, 18, 408, 389

[56] References Cited

UNITED STATES PATENTS

| | | | |
|---|---|---|---|
| 3,638,067 | 1/1972 | Dietz | 315/27 TD |
| 3,714,503 | 1/1973 | West | 315/27 TD |
| 3,749,966 | 7/1973 | Ahrens | 315/27 TD |
| 3,784,871 | 1/1974 | Vacher | 315/27 TD |

*Primary Examiner*—Maynard R. Wilbur
*Assistant Examiner*—J. M. Potenza
*Attorney, Agent, or Firm*—Cushman, Darby & Cushman

[57] ABSTRACT

An electron beam deflection circuit including thyristors comprising essentially: a first switching means consisting of a thyristor and a diode connected with opposite polarities, conductive during the trace portion of the scan so as to connect together a capacitor and a deflection winding, a second switching means to bring about, in co-operation with a reactive circuit, the forced commutation of the thyristor which is to be turned off during retrace. Means for drawing an additional current from the first switching means in the direction of conduction of the diode is provided in the shape of a resistor connected in parallel with the capacitor so as to lengthen the turn-off time of the thyristor circuit.

5 Claims, 7 Drawing Figures

ELECTRON BEAM DEFLECTION CIRCUIT INCLUDING THYRISTORS

The present invention relates to electron beam deflection circuits including thyristors, such as silicon controlled rectifiers and relates, in particular, to horizontal deflection circuits for television receivers.

The present invention constitutes an improvement in the circuit described in U.S. Pat. No. 3,449,623 filed on Sept. 6, 1966, this circuit being described in greater detail below with reference to FIGS. 1 and 2 of the accompanying drawings. A deflection circuit of this type comprises a first thyristor switch which allows the conenction of the horizontal deflection winding to a constant voltage source during the time interval used for the transmisstion of the picture signal and for applying this signal to the grid of the cathode ray tube (this interval will be termed the "trace portion" of the scan), and a second thyristor switch which provides the forced commutation of the first one by applying to it a reverse current of equal amplitude to that which passes through it from the said voltage source and thus to initiate the retrace during the horizontal blanking interval.

A undirectional reverse blocking triode type thyristor or silicon controlled rectifier (SCR), such as that used in the aformentioned circuit, requires a certain turn-off time between the instant at which the anode current ceases and the instant at which a positive bias may be applied to it without turning it on, due to the fact that there is still a high concentration of free carriers in the vicinity of the middle junction, this concentration being reduced by a process of recombination independently from the reverse polarity applied to the thyristor. This turn-off time of the thyristor is a function of a number of parameters such as the junction temperature, the DC current level, the decay time of the direct current, the peak level of the reverse current applied, the amplitude of the reverse anode to cathode voltage, the external impedance of the gate electrode, and so on, certain of these varying considerably from one thyristor to another.

In horizontal deflection circuits for television receivers, the flyback or retrace time is limited to approximately 20 percent of the horizontal scan period, the retrace time being in the case of the CCIR standard of 625 lines, approximately 12 microseconds and, in the case of the French standard of 819 lines, approximately 9 microseconds. During this relatively short interval, the thyristor has to be rendered non-conducting and the electron beam has to be returned to the origin of the scan. The first thyristor is blocked by means of a series resonant LC circuit which is subject to a certain number of restrictions (limitations as to the component values employed) due to the fact that, inter alia, it simultaneously determines the turn-off time of the circuit which blocks the thyristor and it forms part of the series resonant circuit which is to carry out the retrace. To obtain proper operation of the deflection circuit of the aforementioned Patent, especially when used for the French standard of 819 lines per image, the values of the components used have to subject to very close tolerances (approximately 2%), which results in high costs.

The improved deflection circuit, object of the present invention, allows the lengthening of the turn-off time of the circuit for turning the scan thyristor off, without altering the values of the LC circuit, which are determined by other criteria, and without impairing the operation of the circuit.

According to the invention, there is provided an electron beam deflection circuit for a cathode ray tube with electromagentic deflection by means of a sawtooth current waveform having a trace portion and a retrace portion, said circuit comprising: a deflection winding; a first source of electrical energy formed by a first capacitor; first controllable switching means comprising a parallel combination of a first thyristor and a first diode, connected together to conduct in opposite directions, for connecting said winding to said first source during said trace portion when said first switching means is turned on; a second source of electrical energy including a first inductive energy storage means coupled to a voltage supply; reactive circuit means including a combination of inductive and capacitive reactances for storing the energy supplied by the said second source; a second controllable switching means, substantially identical with the first one, for completing a circuit including said reactive circuit means and said first switching means, when turned on, so as to pass through said first thyristor an oscillatory current in the opposite direction to that which passes through it from said first source and to turn it off after these two currents cancel out, the oscillatory current then flowing through said first diode for an interval termed the circuit turn-off time which has to be greater than the turn-off time of said first thyristor; and means for drawing during at least a part of said trace portion a substantial amount of additional current from said first switching means in the direction of conduction of said first diode, whereby said circuit turn-off time is lengthened in proportion to the amount of said additional current, without altering the values of the reactances in the reactive circuit by shifting the waveform of the current flowing through said first switching means towards the negative by an amount equal to that of said additional current.

A further object of the invention consists in using the supplementary current in the recovery diode of the first switching means to produce a DC voltage which may be used as a power supply for the vertical deflection circuit of the television receiver, for example.

The invention will be better understood and other features and advantages thereof will become apparent from the following description and the accompanying drawings, given by way of example, and in which.

In all these Figures the same reference numerals refer to the same components.

Figure 1:
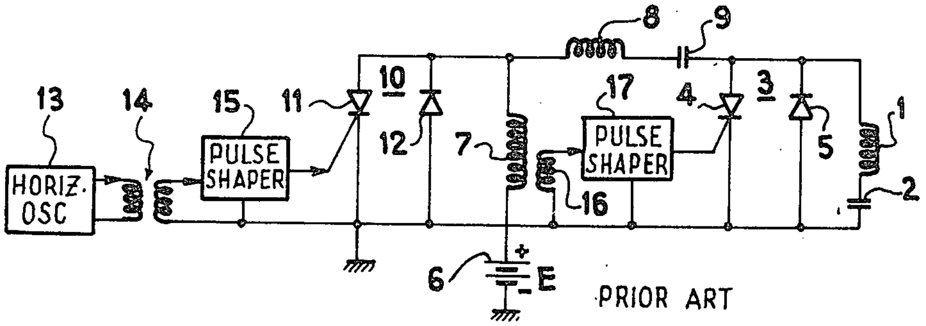
FIG. 1 is a schematic circuit diagram partially in bloc diagram form of a prior art deflection circuit according to the aforementioned Patent.

FIG. 1 shows the horizontal deflection circuit described and claimed in the U.S. Pat. No. 3,449,623 mentioned above, which comprises a first source of electrical energy in the shape of a first capacitor 2 having a high capacitance $C_2$ for supplying a substantially constant voltage $Uc_2$ across its terminals. A first terminal of the first capacitor 2 is connected to ground, whilst its second terminal which supplies a positive voltage is connected to one of the terminals of a horizontal deflection winding shown as a first inductance 1. A first switching means 3, consisting of a first reverse blocking triode thyristor 4 (SCR) and a first recovery diode 5 in parallel, the two being interconnected to conduct current in opposite directions, is connected in parallel with the series combination formed by the deflection winding 1 and the first capacitor 2. The assembly of components 1, 2, 4 and 5 forms the final stage of the horizontal deflection circuit in a television receiver using electromagnetic delfection.

The deflection circuit also includes a drive stage for this final stage which here controls the turning off of the first thyristor 4 to produce the retrace or fly-back portion of the scan during the line-blanking intervals i.e. while the picture signal is not transmitted. This driver stage comprises a second voltage source in the shape of a DC power supply 6 which delivers a constant high voltage E. The negative terminal of the power supply 6 is connected to ground and its positive terminal to one of the terminals of a second inductance 7 of relatively high value, which draws a substantially lineraly varying current from the power supply 6 to avoid its overloading. The other terminal of the second inductance 7 is connected, on the one hand, to the junction of the deflection winding 1 and the first switching means 3 by means of a second inductance 8 and a second capacitor 9 in series and, on the other hand, to one of the terminals of a second controllable bi-directionally conducting switching means 10, similar to the first one 3, including a parallel combination of a second thyristor 11 and a second recovery diode 12 also arranged to conduct in opposite directions.

The respective values of the third inductance 8 ($L_8$) and of the second capacitor 9 ($C_9$) are principally selected so that, on the one hand, one half-cycle of oscillation of the first series resonant circuit $L_8 - C_9$, (i.e. $\pi \quad L_8 \cdot C_9$) is longer than the turn-off time of the first thyristor 4, but still is as short as possible since this time interval determines the speed of the commutation of the thyristor 4, and, on the other hand, one half-cycle of oscillation of another series resonant circuit formed by $L_1$, $L_8$ and $C_9$, i.e. $\pi \quad (L_1 + L_8) \cdot C_9$, is substantially equal to the required retrace time interval (i.e. shorter than the horizontal blanking interval).

The gate (control electrode) of the second thyristor 11 is coupled to the output of the horizontal oscillator 13 of the television receiver by means of a first pulse transformer 14 and a first pulse shaping circuit 15 so that it is fed short triggering pulses which are to turn it on.

The gate of the first thyristor 4 fed with signals of a substantially rectangular waveform which are negative during the horizontal blanking intervals, is coupled to a winding 16 by means of a second pulse shaping circuit 17, the winding 16 being magnetically coupled to the second inductance 7 to make up the secondary winding of a transformer of which the inductance 7 forms the primary winding. It will be noted here that it is also possible to couple the secondary winding 16 magnetically to a primary winding connected to a suitable output (not shown) of the horizontal oscillator 13.

The operation of a circuit of this type will be explained below with reference to FIG. 2 which shows the waveforms at various points in the circuit of FIG. 1 during approximately one line period.

Figure 2:
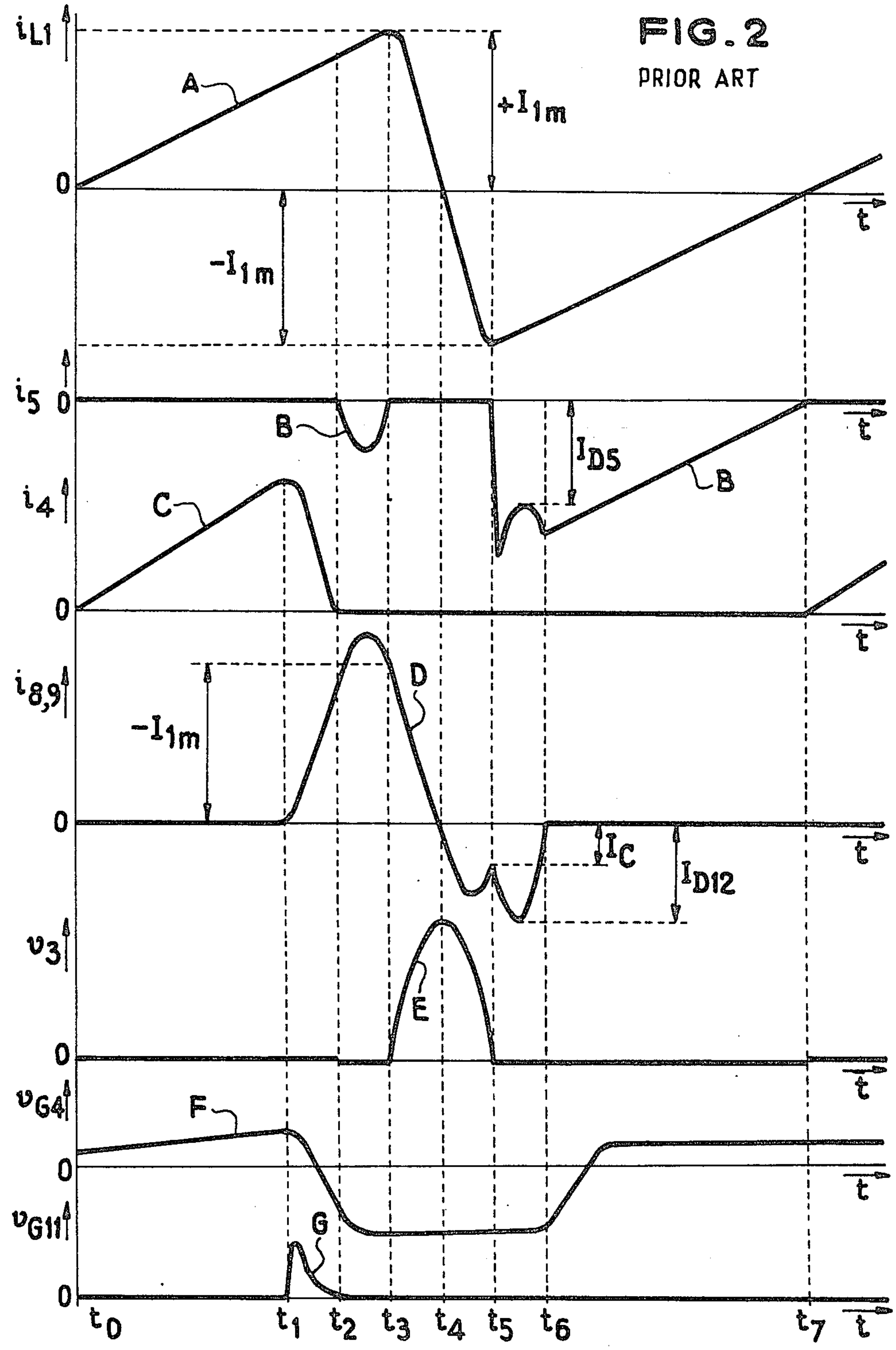
FIG. 2 shows waveforms of currents and voltages generated at various points in the circuit of FIG. 1.

FIG. 2 is not to scale since one line period ($t_7 - t_0$) is equal to 64 microseconds in the case of 625 lines and 49 microseconds in the case of 819 lines, while the durations of the respective horizontal blanking intervals are approximately 12 and 9.5 microseconds.

Waveform A shows the form of the current $i_{L1}$ passing through deflection winding 1, this current having a sawtooth waveform substantially linear from $t_0$ to $t_3$ and from $t_5$ to $t_7$, and crossing zero at time instants $t_0$ and $t_7$, and reaching values of $+ I_{1m}$ and $- I_{1m}$, at time instants $t_3$ and $t_5$respectively, these being its maximum positive and negative amplitudes.

During the second half of the trace portion of the horizontal deflection cycle, that is to say from $t_0$ to $t_3$, the thyristor 4 of the first switching means 3 is conductive and makes the high value capacitor 2 discharge through the deflector winding 1, which has a high inductance, so that current $i_{L1}$ increases linearly.

A few microseconds (5 to 8 $\mu s$) before the end of the trace portion, i.e. at time instant $t_1$, the trigger of the second thyristor 11 receives a short voltage pulse $V_{G11}$ which causes it to turn on as its anode is at this instant at a positive potential with respect to ground, which is due to the charging of the second capacitor 9 through inductances 7 and 8 by the voltage E from the power supply 6.

When thyristor 11 is made conductive at time $t_1$, on the one hand, inductance 7 is connected between ground and the voltage source 6 and a linearly increasing current flows through it and, on the other hand, the reactive circuit 8, 9 forms a loop through the second and first switching means 10 and 3, thus forming a resonant circuit which draws an oscillatory current $i_{8,9}$ of frequency $$f_1 = \frac{1}{2\pi \quad L_8 \cdot C_9}.$$

This oscillatory current $i_{8,9}$ will pass through the first switching means 3, i.e. thyristor 4 and diode 5, in the opposite direction to that of current $i_{L1}$. Since the frequency $f_1$ is high, current $i_{8,9}$ will increase more rapidly than $i_{L1}$ and will reach the same level at time $t_2$, that is to say $i_{8,9}(t_2) = -i_{L1}(t_2)$ and these currents will cancel out in the thyristor 4 in accordance with the well known principle of forced commutation. After time instant $t_2$, current $i_{8,9}$ continues to increase more rapidly than $i_{L1}$, but the difference between them ($i_{8,9} - i_{L1}$) passes the diode 5 (see wave form B) until it becomes zero at time instant $t_3$ which is the turn off time instant of the first switching means 3, at which the retrace begins.

The interval between the time instant $t_2$ and $t_3$, i.e. ($t_3 - t_2$), during which diode 5 is conductive and the thyristor is reverse biased will be termed in what follows the circuit turn-off time and it should be greater than the turn-off time of the thyristor 4 itself since the latter will subsequently become foward biased (i.e. from $t_3$ to $t_5$) by the retrace or flyback pulse (see waveform E) which should not trigger it.

At time instant $t_3$, the switching means 3 is opened ($i_4$ and $i_5$ are both zero — see waveforms B and C) and the reactive circuit 8, 9 forms a loop through capacitor 2 and the deflection coil 1 and thus a series resonant circuit including ($L_1 + L_8$) and $C_9$, $C_2$ being of high value and representing a short circuit for the flyback frequency $$f_2 = \frac{1}{2\pi \quad (L_1 + L_8)\, C_9}$$

thus obtained.

The retrace which stated at time $t_3$ takes place during one half-cycle of the resonant circuit formed by reactances $L_1$, $L_8$ and $C_9$, i.e. during the interval between $t_3$ and $t_5$. In the middle of this interval i.e. at time instant $t_4$, both $i_{L1}$ (waveform A) and $i_{8,9}$ (waveform D) pass through zero and change their sign, whereas the voltage at the terminals of the first switching means 3 ($V_3$, waveform E) passes through a maximum. Thus, from $t_4$ onwards, thyristor 11 will be reverse biased and diode 12 will conduct the current from the resonant circuit 1, 8 and 9 in order to turn the second thyristor 11 off.

At time instant $t_5$, when current $i_{L1}$ has reached $-I_{1m}$ and when voltage $v_3$ falls to zero, diode 5 of the first switching means 3 becomes conductive and the trace portion of scan begins.

Current $i_{8,9}$ nevertheless continues to flow in the resonant circuit 8, 9 through diodes 5 and 12, which causes a break to appear in waveform D at $t_5$, and a negative peak to appear in waveform D and a positive one in waveform B in the interval between $t_5$ and $t_6$, these being principally due to the distributed capacities of coil 1 or to an eventual capacitor (not shown) connected in parallel to the first switching means 3.

At time instant $t_6$, diode 12 of the second switching means 10 ceases to conduct after having allowed thyristor 11 time to become turned off completely.

The level of current $i_{8,9}$ at time instant $t_5$ (i.e. $I_c$) as well as the negative peak $I_{D12}$ in $i_{8,9}$ and the positive peak $I_{D5}$ in $i_5$ depend on the values of $L_8$ and $C_9$ in the same way as does the turn-off time of the circuit ($t_3 - t_2$). If, for example, $L_8$ and $C_9$, are increased $I_{D5}$ increases towards zero and this could cause diode 5 to be cut off in an undesirable fashion. $I_c$ also increases towards zero, which is liable to cause diode 12 to be blocked and thyristor 11 to trigger prematurely.

From the foregoing it can be clearly seen that the choice of values for $L_8$ and $C_9$ is subject to four limitations which prevent the values from being increased to lengthen the turn-off time of the driver circuit of first switching thyristor 4 so as to forestall its spurious triggering.

Waveform F shows the voltage $v_{G4}$ obtained at the gate of thyristor 4 from the secondary winding 16 coupled to the inductor 7. This voltage is positive from $t_0$ to $t_1$ and from $t_6$ to $t_7$ and is negative between $t_2$ and $t_6$ i.e. while the second switching means 10 is conducting.

The present invention makes the lengthening of the turn-off time of thyristor 4 possible without altering the parameters of the circuit such as inductance 8 and capacitor 9.

Figure 3:
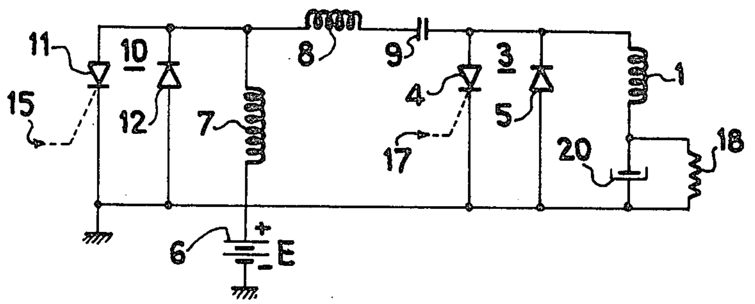
FIG. 3 is a schematic diagram of a deflection circuit according to the invention which allows the principle of the improvement to be explained.
Figure 4:
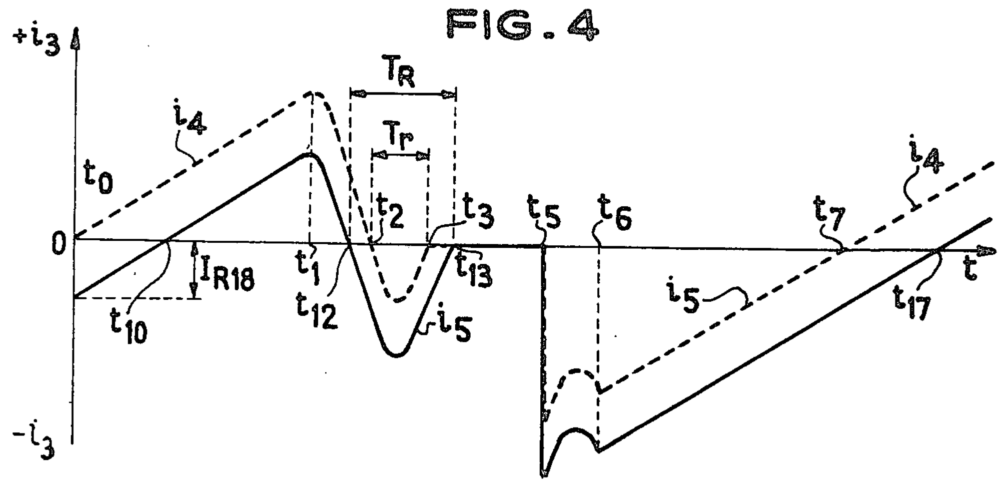
FIG. 4 is a diagram of the waveforms of the current through the first switching means 4, 5 of the circuit of FIG. 3.

In the circuit shown in FIG. 3, which illustrates the principle of the present invention, means are added to the circuit in FIG. 1 which enable the turn-off time to be lengthened by connecting a load to diode 5 so as to increase the current which flows through it during the time that it is conductive. These means are here formed by a resistor 18 connected in parallel with a capacitor 20 (which replaces capacitor 2) which is of a higher capacitance so that, in practice, it holds its charge during at least one half of the line period. FIG. 4, which shows the waveform of the current in the first switching means 3 for a circuit as shown in FIG. 3, makes it possible to explain how this lenthening of the turn-off time is achieved.

In FIG. 4, the broken lines show the waveform of the current in the first switch device 3 in the circuit of FIG. 1, this waveform being produced by adding waveforms B and C of FIG. 2. The current $i_4$ above the axis flows through thyristor 4 and current $i_5$ below the axis flows through diode 5. When the capacitance $C_{20}$ of the capacitor in series with the deflector coil is increased to some tens of microfarads ($C_2$ having been of the order of 1 $\mu$ F) and when there is connected in parallel with capacitor 20 a resistor 18 the value of which is calculated to draw a strong current $I_{R18}$ from capacitor 20, that is to say a current at least equal to 0,1 $I_m$ ($I_m$ being of the order of some tens of amperes), current $I_{R18}$ is added to that $i_5$ which flows through diode 5 without in any way altering the linearity of the trace portion nor the oscillatory commutation of thyristor 4 which is brought about by the resonant circuit $L_8$, $C_9$.

The fact of loading capacitor $C_{20}$ by means of a resistor 18 thus has the effect of permanently displacing the waveform of the current in the negative direction by $I_{R18}$. Thus, during the trace portion of the scan, the transfer of the current from the diode 5 to the thyristor 4 begins at time $t_{10}$ instead of $t_0$, that is to say with a delay proportional to $I_{R18}$. The effect of the triggering pulse delivered by the horizontal oscillator (13 FIG. 1) to the second thyristor 11 at time instant $t_1$, will be to start the commutation process of the first thyristor 4 when the current it draws is less by $I_{R18}$ than that $i_4$ ($t_1$) which it would have been drawing had there been no resistor 18. Because of this, the turn-off time of the thyristor 4 proper, which as has been mentioned increases with the maximum current level passing throught it, is slightly reduced. Moreover, because the oscillatory current $i_{8,9}$ (FIG. 2) from circuit $L_8$, $C_9$ which flows through thyristor 4 in the opposite direction is unchanged, it reaches a value equal to that of the current $i_{L1}$ (FIG. 1) flowing in the coil 1 in a shorter time, that is to say at time $t_{12}$. Diode 5 will thus take the oscillatory current $i_{8,9}$ (FIG. 2) over in advance with respect ro time instant $t_2$ and will conduct it until it reaches zero value at a time instant $t_{13}$ later than $t_3$, the amounts of advance ($t_2 - t_{12}$) and delay ($t_{13} - t_3$) being practically equal.

It can thus be seen in FIG. 4 that the circuit turn-off time $T_R$ of a circuit according to the invention and illustrated by FIG. 3 is distinctly longer than that $T_r$ of the circuit in FIG. 1. This increase in the turn-off time ($T_R - T_r$) depends on the current $I_{R18}$ and increases therewith.

It should be noted at this point that the current $I_{R18}$ produces a voltage drop at the terminals of the resistor the only effect of which is to heat up the resistor since the level of this voltage (40 to 60 volts) does not necessarily have a suitable value to be used as a voltage supply for other circuits in an existing transistorised television receiver.

Figure 5:
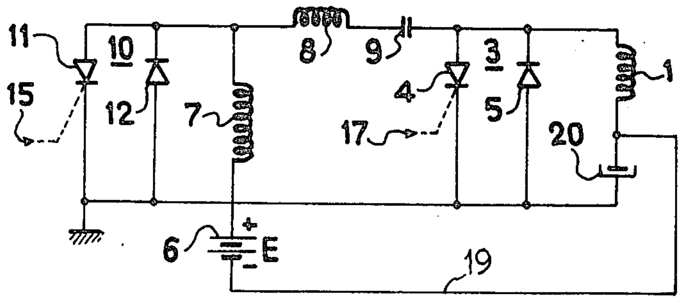
FIG. 5 is a circuit diagram of another embodiment of the circuit according to the invention.

In accordance with one embodiment of the invention, illustrated in FIG. 5, an application is proposed for the additional current which is to be drawn through diode 5. In FIG. 5, the positive terminal of capacitor 20 is connected by a conductor 19 to the negative pole of the power supply 6 and the voltage at the terminals of capacitor 20 is thus added to that E from the source 6.

Figures 6, 7:
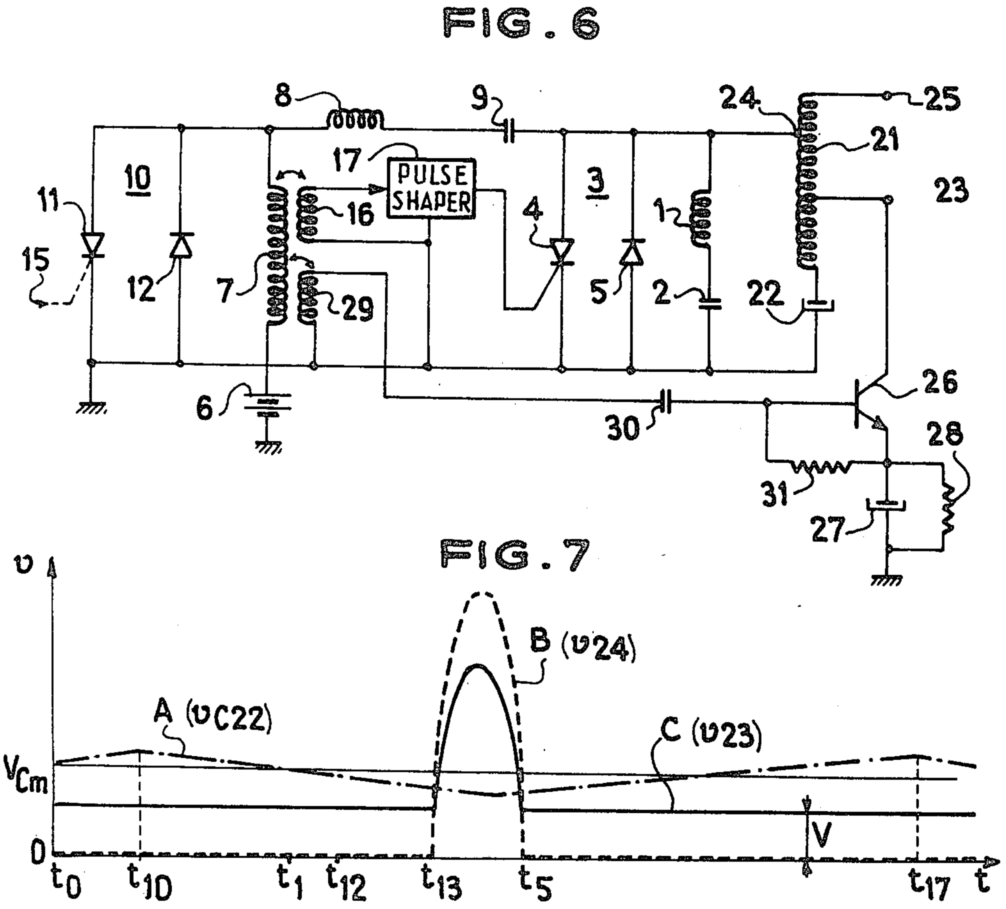
FIG. 6 is a schematic representation of the preferred embodiment of the circuit according to the invention.
FIG. 7 shows voltage waveforms at various points of the high voltage autotransformer 21 of FIG. 6.

In the preferred embodiment of the present invention, which is shown in FIG. 6, it is possible to cause a supplementary current of a desired value to flow through the first diode 5 while obtaining a voltage which has a suitable value for use in another circuit in the television receiver.

If the voltage at the terminals of capacitor 20 in FIG. 3 is not a usable value, it is possible to connect in parallel with the series circuit comprising the deflector coil 1 and the capacitor 2 in FIG. 1, i.e. in parallel with the terminals of the first switching means 3, a series combination of an autotransformer 21 and a high value capacitor 22 (comparable with capacitor 20 in FIGS. 3 and 5). The autotransformer 21 has a tap 23 is suitably positioned between the terminal connected to capacitor 22 at the tap 24 connected to the first switching means 3. This autotransformer 21 may be formed by the one conventionally used for supplying a very high voltage to the cathode ray tube, as described for example in U.S. Pat. No. 3,452,244; such a transformer comprises a voltage step-up winding between taps 24 and 25, which latter is connected to a high voltage rectifier (not shown).

The waveform of the voltage at the various points in the autotransformer is shown in FIG. 7, in which waveform A shows the voltage at the terminals of capacitor 22, waveform B the voltage at tap 24 and waveform C the voltage at tap 23 of the autotransformer 21.

The voltage $V_{c22}$ at the terminals of capacitor 22 varies slightly about a mean value $V_{cm}$. It is increasing while diode 5 is conducting and decreasing during the conduction of the thyristor 4.

The voltage $v_{24}$ at tap 24 follows substantially the same curve as waveform E in FIG. 2, that is to say that during the retrace time interval from $t_{13}$ to $t_5$ to a positive pulse called the flyback pulse is produced and, during the time interval while the first switching means 3 is conducting, the voltage is zero. The mean valve of the voltage $v_{24}$ at tap 24 of the auto-transformer 21 is equal to the mean value $V_{cm}$ of the voltage at the terminals of capacitors 2 and 22.

Thus, there is obtained at tap 23 a waveform which is made up, during the retrace portion, of a positive pulse whose maximum amplitude is less than that of $v_{24}$ at tap 24 and, during the trace portion, of a substantially constant positive voltage, the level V of which is less than the mean value $V_{cm}$ of the voltage $v_{c22}$ at the terminals of capacitor 22. By moving tap 23 towards terminals 24 the amplitude of the pulse during fly-back increases while voltage V falls and conversely by moving tap 23 towards capacitor 22 voltage V increases and the amplitude of the pulse drops.

In more exact terms, the voltage V at tap 23 is such that the means value of $v_{23}$ is equal to $V_{cm}$. It has thus been shown that by choosing carefully the position of tape 23, a voltage V may be obtained during the trace portion of the scan, which may be of any value between $V_{cm}$ and zero.

This voltage V is thus obtained by periodically controlled rectification during the trace portion of the scan. For this purpose an electronic switch is used to periodically connect the tap 23 of trnasformer winding 21 to a load. This switch is made up of a power transistor 26 whose collector is connected to tap 23 and the emitter to a parallel combination formed by a high value filtering capacitor 27 and the load which it is desired to supply, which is represented by a resistor 28. The base of the transistor 26 receives a control voltage to block it during retrace and to unblock it during the whole or part of the trace period. A control voltage of this type may be obtained from a second winding 29 magnetically coupled to the inductance 7 of the deflection circuit and it may be transmitted to the base of transistor 26 by means of a coupling capacitor 30 and a resistor 31 connected between the base and the emitter of transistor 26.

It may easily be seen that the DC collector/emitter current in transistor 26 flows through the first diode 5 of the first switching means 3 via a resistor 28 and the part of the winding of auto-transformer 21 located between taps 23 and 24.

Experience has shown that a circuit as shown in FIG. 6 can supply 24 volts with a current of 2 amperes to the vertical deflection circuit of the same television set, the voltage at the terminals of capacitor 22 being from 50 to 60 volts.

It should be mentioned that, when the circuit which forms the load of the controlled rectifier 26, 27 does not draw enough current to sufficiently lengthen the circuit turn-off time $T_R$, an additional resistor (not shown) may be connected between the emitter of transistor 26 and ground or in parallel to capacitor 22, which resistor will draw the additional current required.

What is claimed is:

1. An electron beam deflection circuit for a cathode ray tube with electromagnetic deflection by means of a sawtooth current waveform having a trace portion and a retrace portion, said circuit comprising: a deflection winding; a first source of electrical energy formed by a first capacitor; first controllable switching means comprising a parallel combination of a first thyristor and a first diode connected together to conduct in opposite directions, for connecting said winding to said first source during said trace portion, while said first switching means is turned on; a second source of electrical energy including a first inductive energy storage means coupled to a voltage supply; reactive circuit means including a combination of inductive and capacitive reactances for storing the energy supplied by said second source; second controllable switching means, substantially similar to said first one, for completing a circuit including said reactive circuit means and said first switching means, when turned on before the end of said trace portion, so as to pass through said first switching means an oscillatory current in opposite direction to that which passes through said first thyristor from said first source and to turn said first thyristor off after these two currents cancel out, the oscillatory current flowing thereafter through said first diode for an interval termed the circuit turn-off time, which has to be greater than the turn-off time of said first thyristor; wherein the improvement comprises: means for drawing, during at least a part of said trace portion, a substantial amount of additional current through said first switching means, in the direction of conduction of said first diode, whereby to perceptibly shift the waveform of the current flowing through said first switching means towards the negative values by an amount equal to that of said substantial additional current and to lengthen, in proportion thereto, said circuit turn-off time, without altering the values of the reactances in the reactive circuit which intervene in the determination of both the circuit turn-off and retrace portion time intervals.

2. A deflection circuit as claimed in claim 1, wherein said amount of additional current is greater than or equal to 5 per cent of the peak-to-peak value of the current flowing through the deflection winding.

3. A deflection circuit as claimed in claim 1, wherein said means for drawing a substantial amount of additional current through said first switching means comprises a resistor connected in parallel to said first capacitor.

4. A deflection circuit as claimed in claim 1, wherein said means for drawing an additional current is formed by connecting said first and second energy sources in series so that the current charging said reactive circuit means forms the said additional current.

5. A deflection circuit as claimed in claim 1, further including a series combination of an autotransformer winding and a second high-value capacitor, said combination being connected in parallel to said first switching means, wherein said autotransformer comprises an intermediate tap located between its terminals respectively connected to said first switching means and to said second capacitor, said tap delivering, during said trace portion, a suitable DC supply voltage lower than the voltage across said second capacitor; and wherein said means for drawing a substantial amount of additional current comprises a load to be fed by said supply voltage and having one terminal connected to ground; and further controllable switching means controlled to conduct during at least part of said trace portion and to remain cut off during said retrace portion, said further switching means being connected between said tap and the other terminal of said load.

* * * * *

UNITED STATES PATENT OFFICE

CERTIFICATE OF CORRECTION

Patent No. 3,906,306 Dated Sept 16, 1975

Inventor(s) Andre Lamoureux

It is certified that error appears in the above-identified patent and that said Letters Patent are hereby corrected as shown below:

[73] Assignee: delete "Thomson-CSF" and insert --Thomson-Brandt--

Signed and Sealed this

Thirteenth Day of July 1976

[SEAL]

*Attest:*

RUTH C. MASON
*Attesting Officer*

C. MARSHALL DANN
*Commissioner of Patents and Trademarks*